United States Patent
Sato et al.

(10) Patent No.: US 11,756,791 B2
(45) Date of Patent: Sep. 12, 2023

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Shingo Sato, Kanazawa Ishikawa (JP); Yuhki Fujino, Kanazawa Ishikawa (JP); Hiroaki Yamashita, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/016,600

(22) Filed: Sep. 10, 2020

(65) Prior Publication Data
US 2021/0305049 A1    Sep. 30, 2021

(30) Foreign Application Priority Data
Mar. 24, 2020    (JP) ................. 2020-052497

(51) Int. Cl.
| | |
|---|---|
| H01L 21/22 | (2006.01) |
| H01L 29/78 | (2006.01) |
| H01L 29/06 | (2006.01) |
| H01L 29/32 | (2006.01) |
| H01L 29/66 | (2006.01) |

(Continued)

(52) U.S. Cl.
CPC ...... *H01L 21/221* (2013.01); *H01L 21/26506* (2013.01); *H01L 29/0634* (2013.01);
(Continued)

(58) Field of Classification Search
CPC ............ H01L 29/1095; H01L 29/7802; H01L 29/66712; H01L 29/0634; H01L 21/221
See application file for complete search history.

(56) References Cited

U.S. PATENT DOCUMENTS 9,219,141 B2 * 12/2015 Tamura ............... H01L 29/0634
2008/0315297 A1    12/2008 Takashita et al.
(Continued)

FOREIGN PATENT DOCUMENTS

| JP | 2009-4668 A | 1/2009 |
|---|---|---|
| JP | 2015-18913 A | 1/2015 |

(Continued)

*Primary Examiner* — Bilkis Jahan
*Assistant Examiner* — Victor V Barzykin
(74) *Attorney, Agent, or Firm* — Allen & Overy LLP (57) ABSTRACT

According to one embodiment, a semiconductor device includes first and second electrodes, first, fourth, and sixth semiconductor regions of a first conductivity type, a junction region, a fifth semiconductor region of a second conductivity type, and a gate electrode. The junction region includes a second semiconductor region of the first conductivity type and a third second semiconductor region of the second conductivity type. The second semiconductor regions and the third semiconductor regions are alternately provided in a second direction perpendicular to a first direction. A concentration of at least one first element selected from the group consisting of a heavy metal element and a proton in the junction region is greater a concentration of the first element in the fourth semiconductor region, or a density of traps in the junction region is greater than that in the first semiconductor region and greater than that in the fourth semiconductor region.

16 Claims, 10 Drawing Sheets

(51) Int. Cl.
*H01L 29/10* (2006.01)
*H01L 21/265* (2006.01)
*H01L 29/08* (2006.01)
*H02M 3/158* (2006.01)

(52) U.S. Cl.
CPC ...... *H01L 29/0878* (2013.01); *H01L 29/1095* (2013.01); *H01L 29/32* (2013.01); *H01L 29/66712* (2013.01); *H01L 29/7802* (2013.01); *H01L 29/7811* (2013.01); *H02M 3/158* (2013.01)

(56) References Cited

U.S. PATENT DOCUMENTS

| | | | |
|---|---|---|---|
| 2009/0032851 A1* | 2/2009 | Pfirsch | H01L 21/221 257/E21.135 |
| 2014/0246755 A1* | 9/2014 | Yoshimura | H01L 29/063 257/617 |
| 2014/0374793 A1* | 12/2014 | Miyazaki | H01L 29/66348 438/530 |
| 2016/0035881 A1* | 2/2016 | Tamura | H01L 29/1095 257/329 |
| 2016/0307993 A1* | 10/2016 | Kuribayashi | H01L 29/47 |
| 2017/0236908 A1* | 8/2017 | Naito | H01L 29/4238 257/48 |
| 2020/0119187 A1* | 4/2020 | Arai | H01L 29/66734 |
| 2020/0395215 A1* | 12/2020 | Kubouchi | H01L 27/0664 |
| 2021/0050345 A1* | 2/2021 | Tamura | H01L 29/7397 |
| 2021/0082702 A1* | 3/2021 | Agata | H01L 21/268 |

FOREIGN PATENT DOCUMENTS

| | | |
|---|---|---|
| JP | 6530867 B1 | 6/2019 |
| WO | 2015-040938 A1 | 3/2015 |
| WO | 2019-130513 A1 | 7/2019 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2020-052497, filed on Mar. 24, 2020; the entire contents of which are incorporated herein by reference.

FIELD

Embodiments described herein relate generally to a semiconductor device and a method for manufacturing the same.

BACKGROUND

Semiconductor devices such as metal oxide semiconductor field effect transistors (MOSFETs) and the like are used in applications such as power conversion. It is desirable for the semiconductor devices to have low power consumption.

DETAILED DESCRIPTION

According to one embodiment, a semiconductor device includes a first electrode, a first semiconductor region of a first conductivity type, a junction region, a fourth semiconductor region of the first conductivity type, a fifth semiconductor region of a second conductivity type, a sixth semiconductor region of the first conductivity type, a gate electrode, and a second electrode. The first semiconductor region is provided on the first electrode and electrically connected to the first electrode. The junction region is provided on the first semiconductor region. The junction region includes a second semiconductor region of the first conductivity type, and a third semiconductor region of the second conductivity type. An impurity concentration of the first conductivity type in the second semiconductor region is less than an impurity concentration of the first conductivity type in the first semiconductor region. A plurality of the second semiconductor regions and a plurality of the third semiconductor regions are alternately provided in a second direction perpendicular to a first direction. The first direction is from the first electrode toward the first semiconductor region. The fourth semiconductor region is provided around the junction region along a first plane perpendicular to the first direction. An impurity concentration of the first conductivity type in the fourth semiconductor region is less than the impurity concentration of the first conductivity type in the first semiconductor region. The fifth semiconductor region is provided on one of the plurality of third semiconductor regions. The sixth semiconductor region is provided on the fifth semiconductor region. The gate electrode faces the fifth semiconductor region via a gate insulating layer. The second electrode is provided on the fifth and sixth semiconductor regions and electrically connected to the fifth and sixth semiconductor regions. A concentration of a first element in the junction region is greater than a concentration of the first element in the first semiconductor region and greater than a concentration of the first element in the fourth semiconductor region, or a density of traps in the junction region is greater than a density of traps in the first semiconductor region and greater than a density of traps in the fourth semiconductor region. The first element is at least one selected from the group consisting of a heavy metal element and a proton.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

In the drawings and the description recited below, the notations of $n^+$, $n$, $n^-$, $p^+$, $p$, and $p^-$ indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In the embodiments described below, each embodiment may be implemented by inverting the p-type and the n-type of each semiconductor region.

Figure 1:
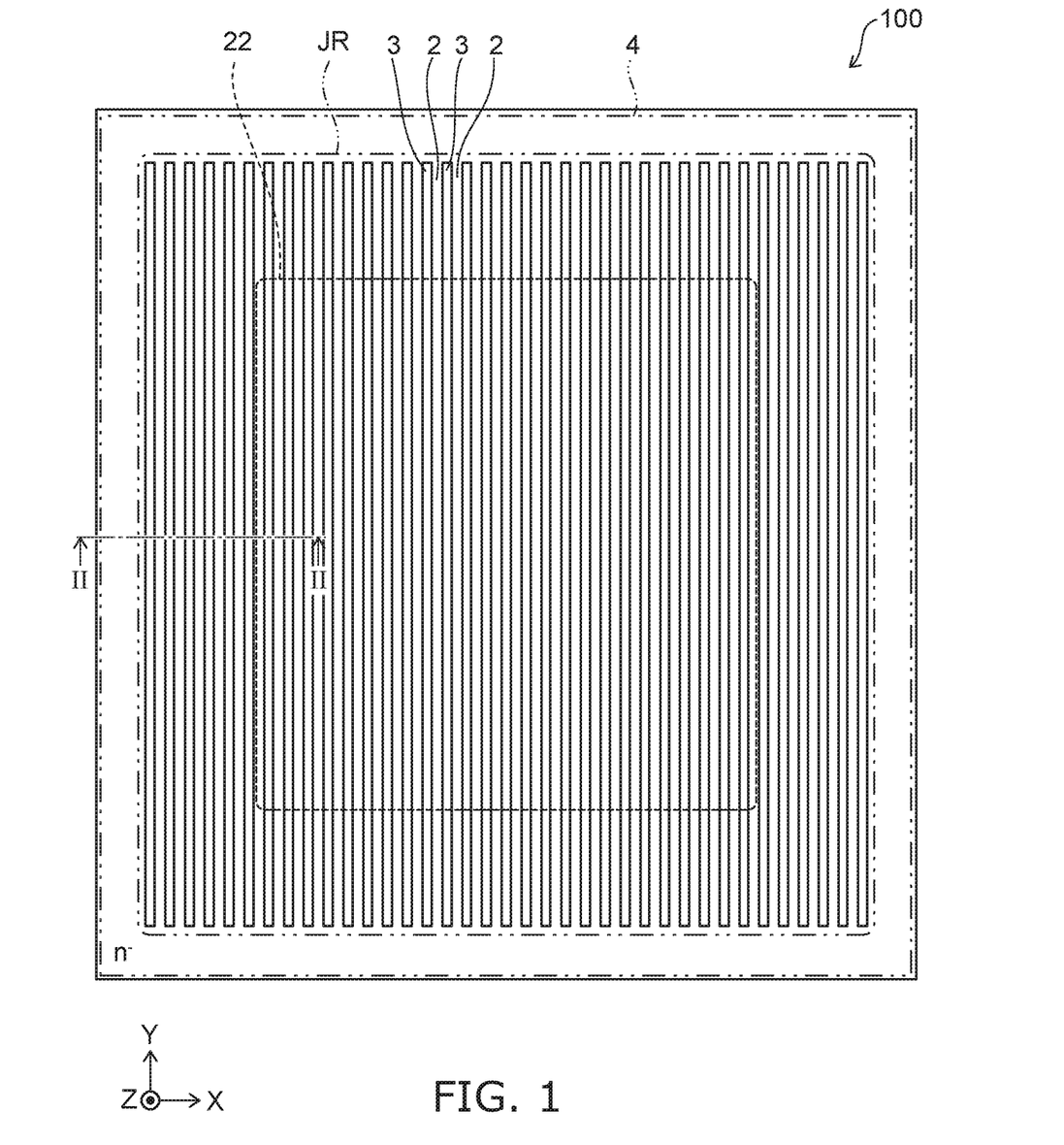
FIG. 1 is a plan view illustrating a semiconductor device according to an embodiment.

FIG. 1 is a plan view illustrating a semiconductor device according to an embodiment.

Figure 2:
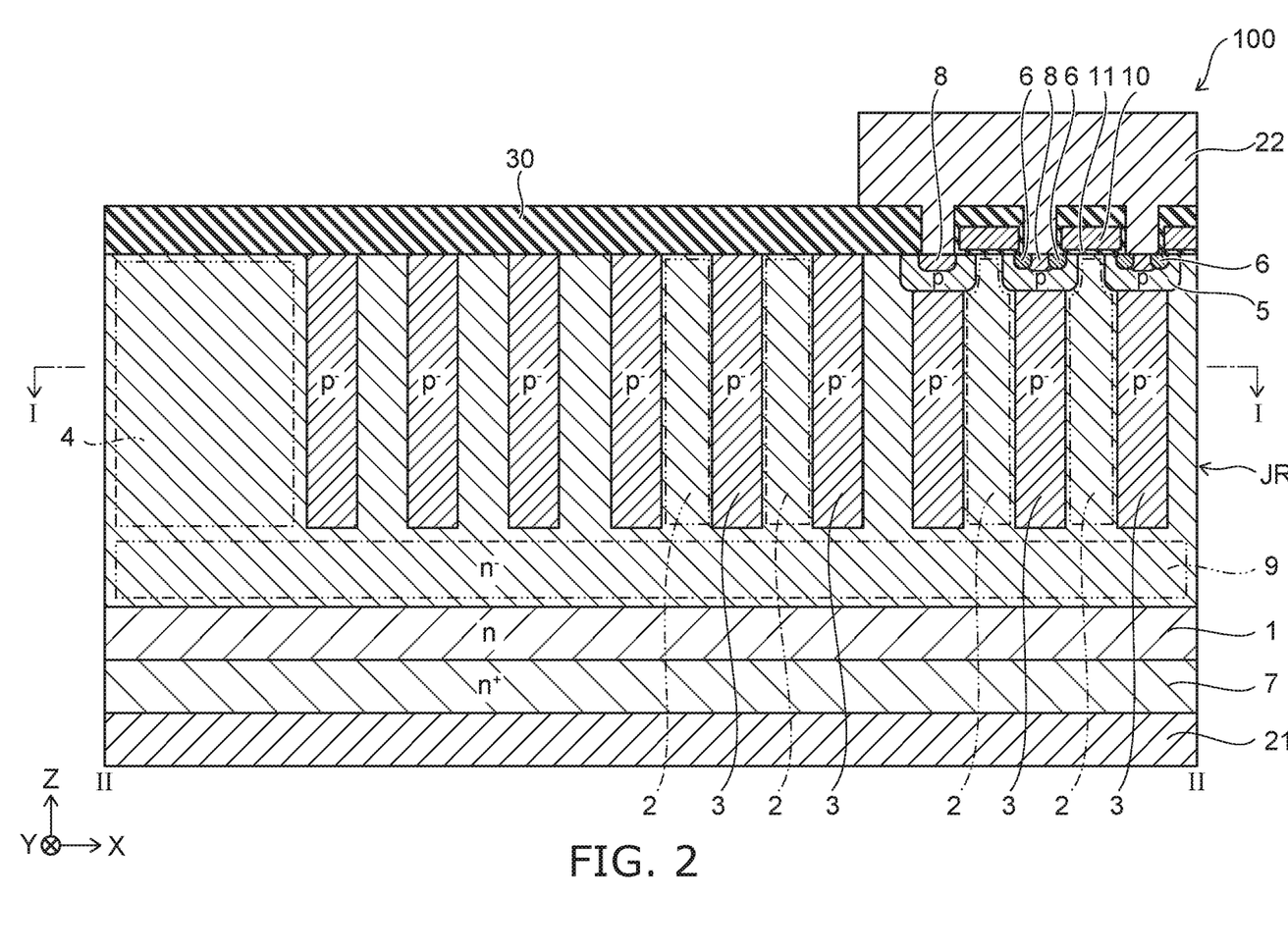
FIG. 2 is a II-II cross-sectional view of FIG. 1.

FIG. 2 is a II-II cross-sectional view of FIG. 1, FIG. 1 is an I-I cross-sectional view of FIG. 2.

The semiconductor device according to the embodiment is a MOSFET. The semiconductor device 100 illustrated in FIGS. 1 and 2 includes an n-type (first-conductivity-type) buffer region 1 (a first semiconductor region), a junction region JR, an $n^-$-type outer perimeter region 4 (a fourth semiconductor region), and a p-type (second-conductivity-type) base region 5 (a fifth semiconductor region). An $n^+$-type source region 6 (a sixth semiconductor region), an $n^+$-type drain region 7 (a seventh semiconductor region), a p$^+$-type contact region 8, a gate electrode 10, a drain electrode 21 (a first electrode), a source electrode 22 (a second electrode), and an insulating portion 30.

An XYZ orthogonal coordinate system is used in the description of the embodiments. The direction from the drain electrode 21 toward the n-type buffer region 1 is taken as a Z-direction (a first direction). Two mutually-orthogonal directions perpendicular to the Z-direction are taken as an X-direction (a second direction) and a Y-direction (a third direction). In the description, the direction from the drain electrode 21 toward the n-type buffer region 1 is called "up", and the reverse direction is called "down". These directions are based on the relative positional relationship between the drain electrode 21 and the n-type buffer region 1 and are independent of the direction of gravity.

The drain electrode 21 is provided at the lower surface of the semiconductor device 100. The n$^+$-type drain region 7 is provided on the drain electrode 21 and is electrically connected to the drain electrode 21. The n-type buffer region 1 is provided on the n$^+$-type drain region 7. The n-type buffer region 1 is electrically connected to the drain electrode 21 via the n$^+$-type drain region 7. The n-type impurity concentration in the n-type buffer region 1 is less than the n-type impurity concentration in the n$^+$-type drain region 7.

The junction region JR is provided on the n-type buffer region 1. The junction region JR includes multiple n$^-$-type pillar regions 2 (second semiconductor regions) and multiple p$^-$-type pillar regions 3 (third semiconductor regions) alternately provided in the X-direction. The n$^-$-type pillar regions 2 and the p$^-$-type pillar regions 3 each extend in the Y-direction. The n-type impurity concentration in the n$^-$-type pillar region 2 is less than the n-type impurity concentration in the n-type buffer region 1.

The n$^-$-type outer perimeter region 4 is provided around the junction region JR along the X-Y plane (a first plane). The n-type impurity concentration in the n$^-$-type outer perimeter region 4 is less than the n-type impurity concentration in the n-type buffer region 1. The n-type impurity concentration in the n$^-$-type outer perimeter region 4 may be equal to the n-type impurity concentration in the n$^-$-type pillar region 2 or may be greater than the n-type impurity concentration in the n$^-$-type pillar region 2.

As illustrated in FIG. 2, an n$^-$-type semiconductor region 9 may be provided between the n-type buffer region 1 and the junction region JR and between the n-type buffer region 1 and the n$^-$-type outer perimeter region 4. The n-type impurity concentration in the n$^-$-type semiconductor region 9 is less than the n-type impurity concentration in the n-type buffer region 1. The n-type impurity concentration in the n$^-$-type semiconductor region 9 is, for example, equal to the n-type impurity concentration in the n$^-$-type outer perimeter region 4.

Multiple p-type base regions 5 are provided in the X-direction. The multiple p-type base regions 5 are provided respectively on the multiple p$^-$-type pillar regions 3. The p-type base regions 5 each extend along the Y-direction.

The n$^+$-type source region 6 and the p$^+$-type contact region 8 are provided on the p-type base region 5. Multiple n$^+$-type source regions 6 and multiple p$^+$-type contact regions 8 are provided respectively on multiple p-type base regions 5. The n$^+$-type source regions 6 and the p$^+$-type contact regions 8 each extend along the Y-direction.

One gate electrode 10 faces one or more p-type base regions 5 via a gate insulating layer 11. In the example illustrated in FIG. 2, the multiple gate electrodes 10 are provided on the junction region JR and are positioned respectively on the multiple n$^-$-type pillar regions 2. One gate electrode 10 faces one n$^-$-type pillar region 2, two p-type base regions 5 adjacent to the one n-type pillar region 2, and two n$^+$-type source regions 6 adjacent to the one n$^-$-type pillar region 2. The gate electrodes 10 each extend along the Y-direction.

The source electrode 22 is provided on the multiple p-type base regions 5, the multiple n$^+$-type source regions 6, and the multiple p$^+$-type contact regions 8 and is electrically connected to the multiple n$^+$-type source regions 6 and the multiple p$^+$-type contact regions 8. The p-type base regions 5 are electrically connected to the source electrode 22 via the p$^+$-type contact regions 8. In FIG. 1, the position of the source electrode 22 in the X-Y plane is shown by a broken line.

The multiple gate electrodes 10 are electrically isolated from the source electrode 22. The insulating portion 30 is provided on the junction region JR and the n$^-$-type outer perimeter region 4 around the multiple gate electrodes 10.

An operation of the semiconductor device 100 will now be described.

A voltage that is not less than a threshold is applied to the gate electrode 10 in a state in which a positive voltage with respect to the source electrode 22 is applied to the drain electrode 21, Thereby, a channel (an inversion layer) is formed in a region of the p-type base region 5 at the gate insulating layer 11 vicinity, and the semiconductor device 100 is set to an on-state. Electrons flow from the source electrode 22 toward the drain electrode 21 via the channel and the n-type pillar region 2. Subsequently, when the voltage that is applied to the gate electrode 10 becomes less than the threshold, the channel in the p-type base region 5 disappears, and the semiconductor device 100 is set to an off-state.

Hereinafter, the "application to the drain electrode 21 of a positive voltage with respect to the source electrode 22" is called simply the "application of a positive voltage to the drain electrode 21". The "application to the source electrode 22 of a positive voltage with respect to the drain electrode 21" is called the "application of a positive voltage to the source electrode 22".

When the semiconductor device 100 is switched from the on-state to the off-state in the state in which the positive voltage is applied to the drain electrode 21, a depletion layer spreads in the Y-direction from the p-n junction surface between the n$^-$-type pillar region 2 and the p$^-$-type pillar region 3 in the junction region JR. The breakdown voltage of the semiconductor device 100 can be increased by the spreading of the depletion layer in the junction region JR. Or, the n-type impurity concentration in the n$^-$-type pillar region 2 can be increased and the on-resistance of the semiconductor device 100 can be reduced while maintaining the breakdown voltage of the semiconductor device 100.

The semiconductor device 100 includes a diode including the p-type semiconductor regions such as the p$^-$-type pillar region 3, the p-type base region 5, etc., and the n-type semiconductor regions such as the n$^-$-type pillar region 2, the n-type buffer region 1, etc. A current flows in the forward direction of the diode when a positive voltage is applied to the source electrode 22. Subsequently, when a positive voltage is applied to the drain electrode 21, the carriers that have accumulated inside the semiconductor device 100 are ejected from the drain and source electrodes 21 and 22. At this time, a recovery current flows in the semiconductor device 100 from the drain electrode 21 toward the source electrode 22.

Examples of the materials of the components will now be described.

The n-type buffer region 1, the n⁻-type pillar region 2, the p⁻-type pillar region 3, the n⁻-type outer perimeter region 4, the p-type base region 5, the n⁺-type source region 6, the n⁺-type drain region 7, the p⁺-type contact region 8, and the n⁻-type semiconductor region 9 include silicon, silicon carbide, gallium nitride, or gallium arsenide as semiconductor materials. Arsenic, phosphorus, or antimony can be used as an n-type impurity when silicon is used as the semiconductor material. Boron can be used as a p-type impurity.

The gate electrode 10 includes a conductive material such as polysilicon, etc. An impurity may be added to the conductive material. The gate insulating layer 11 and the insulating portion 30 include an insulating material such as silicon oxide, silicon nitride, etc. The drain electrode 21 and the source electrode 22 include metals such as aluminum, titanium, etc.

The junction region JR includes a first element. The first element is at least one selected from the group consisting of a heavy metal element and a proton. The heavy metal element is at least one selected from the group consisting of gold and a platinum group element. The platinum group element is at least one selected from the group consisting of ruthenium, rhodium, palladium, osmium, iridium, and platinum.

The n-type buffer region 1 and the n⁻-type outer perimeter region 4 may or may not include the first element. In any case, the concentration of the first element in the junction region JR is greater than the concentration of the first element in the n-type buffer region 1 and greater than the concentration of the first element in the n⁻-type outer perimeter region 4. More specifically, the concentrations of the first element in the n⁻-type pillar region 2 and the p⁻-type pillar region 3 each are greater than the concentration of the first element in the n-type buffer region 1 and greater than the concentration of the first element in the n⁻-type outer perimeter region 4.

Due to this concentration relationship, the carrier lifetime from the generation to the disappearance of the excess carriers in the junction region JR is shorter than the carrier lifetimes in the n-type buffer region 1 and the n⁻-type outer perimeter region 4.

FIGS. 3A to 5B are cross-sectional views illustrating a method for manufacturing the semiconductor device according to the embodiment.

Figure 3A:
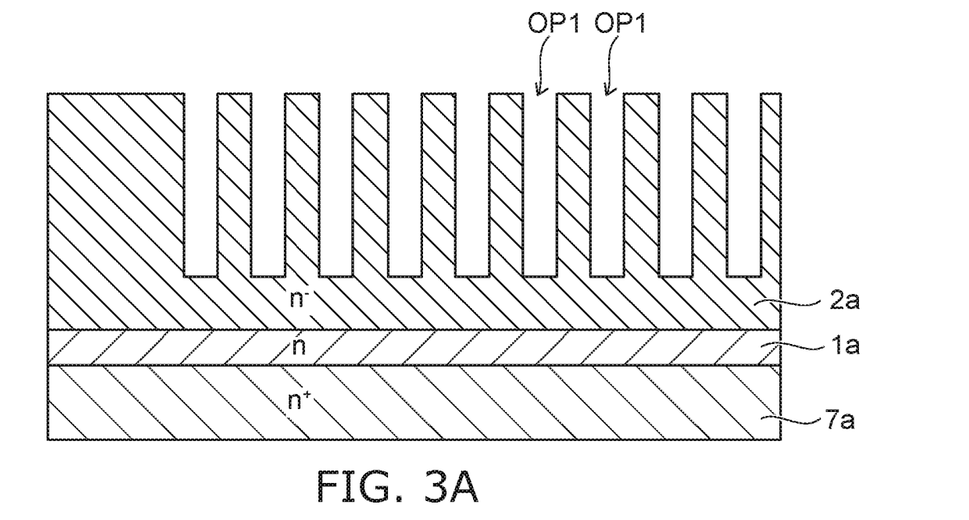
FIGS. 3A and 3B are cross-sectional views illustrating a method for manufacturing the semiconductor device according to the embodiment.

First, an n⁺-type semiconductor substrate 7a is prepared. An n-type semiconductor layer 1a and an n⁻-type semiconductor layer 2a are epitaxially grown sequentially on the n⁺-type semiconductor substrate 7a. As illustrated in FIG. 3A, multiple openings OP1 that extend in the Y-direction are formed in the n⁻-type semiconductor layer 2a by reactive ion etching (RIE). The openings OP1 may extend through the n⁻-type semiconductor layer 2a or may not extend through the n⁻-type semiconductor layer 2a.

As an example, the thickness of the n⁻-type semiconductor layer 2a is not less than 40 μm and not more than 70 μm. The width (the dimension in the X-direction) of the opening OP1 is not less than 2 μm and not more than 8 μm. The spacing between the openings OP1 is not less than 4 μm and not more than 16 μm. The depth (the dimension in the Z-direction) of the opening OP1 is not less than 40 μm and not more than 70 μm.

Figure 3B:
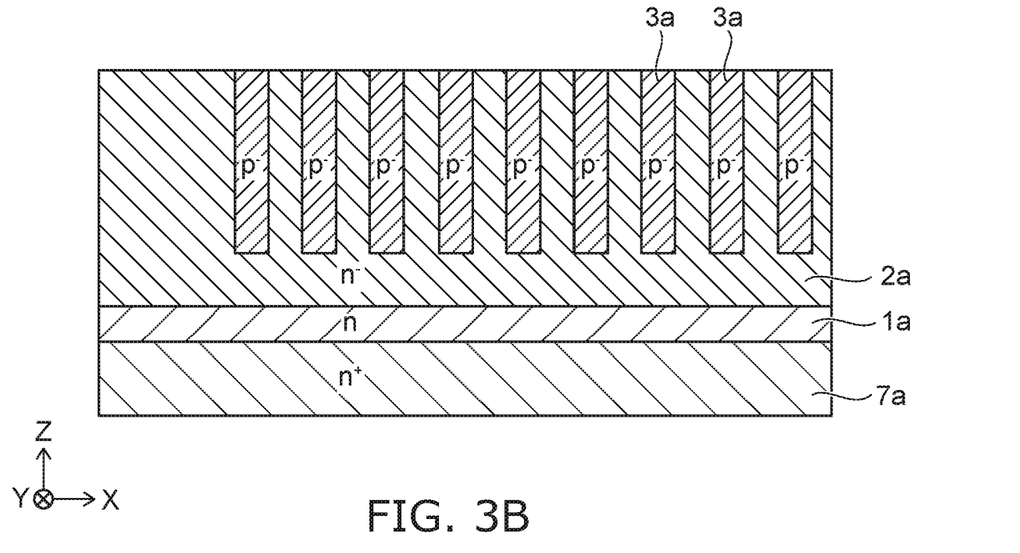

A p-type semiconductor layer that fills the multiple openings OP1 is epitaxially grown. The upper surface of the p-type semiconductor layer is planarized by polishing, and the position of the upper surface is caused to recede. Thereby, as illustrated in FIG. 3B, multiple p⁻-type semiconductor layers 3a are formed in the n⁻-type semiconductor layer 2a. The p⁻-type semiconductor layers 3a correspond to the p⁻-type pillar regions 3. The n⁻-type semiconductor layer 2a that is positioned between the p⁻-type semiconductor layers 3a corresponds to the n⁻-type pillar regions 2. The n⁻-type semiconductor layer 2a that is around the multiple p⁻-type semiconductor layers 3a corresponds to the n⁻-type outer perimeter region 4.

Figure 4A:
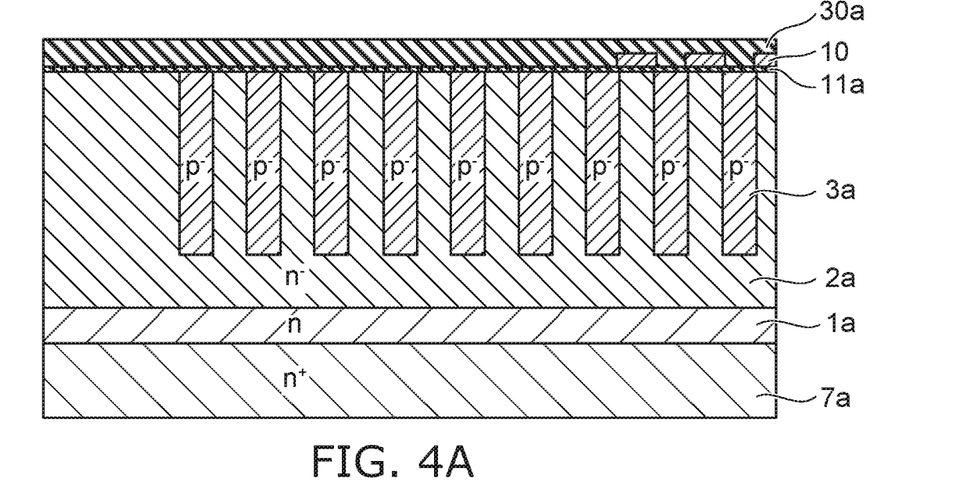
FIGS. 4A and 4B are cross-sectional views illustrating a method for manufacturing the semiconductor device according to the embodiment.

An insulating layer 11a is formed at the upper surfaces of the n⁻-type semiconductor layer 2a and the p⁻-type semiconductor layer 3a by thermal oxidation. A conductive layer is formed on the insulating layer 11a by depositing a conductive material (polysilicon) by chemical vapor deposition (CVD). The multiple gate electrodes 10 are formed by patterning the conductive layer. As illustrated in FIG. 4A, an insulating layer 30a that covers the multiple gate electrodes 10 is formed by CVD.

Figure 4B:
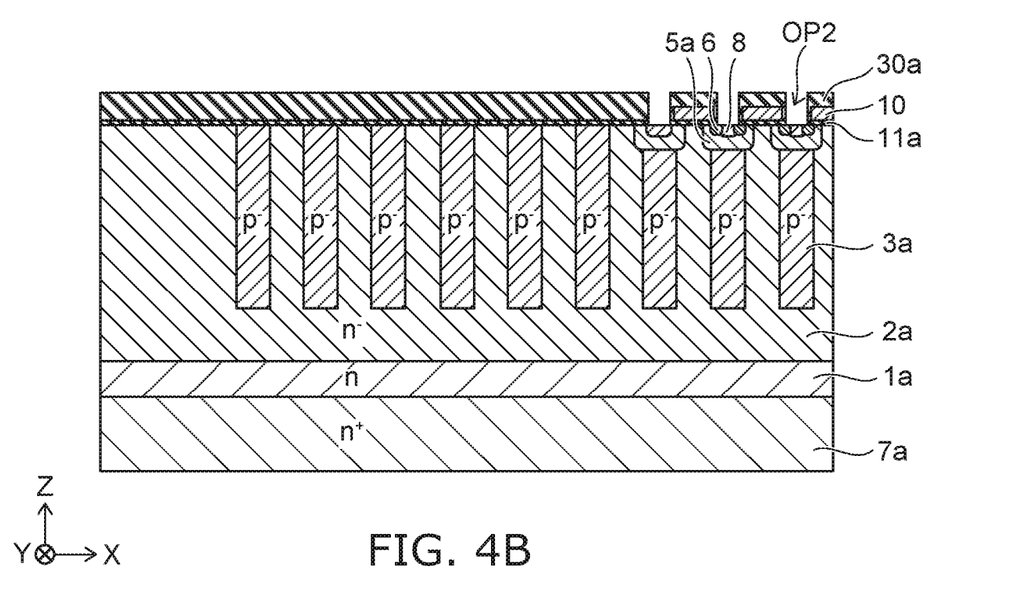

Openings OP2 that extend through the insulating layers 11a and 30a between the gate electrodes 10 are formed by RIE. The n⁻-type semiconductor layer 2a and the multiple p⁻-type semiconductor layers 3a are covered with the insulating layer 30a around the multiple gate electrodes 10. The multiple p-type semiconductor regions 5a are formed by ion-implanting a p-type impurity into the upper surfaces of the multiple p⁻-type semiconductor layers 3a via the openings OP2. As illustrated in FIG. 4B, the multiple n⁺-type source regions 6 and the multiple p⁺-type contact regions 8 are formed respectively by sequentially ion-implanting an n-type impurity and a p-type impurity into the upper surfaces of the multiple p-type semiconductor regions 5a.

Figure 5A:
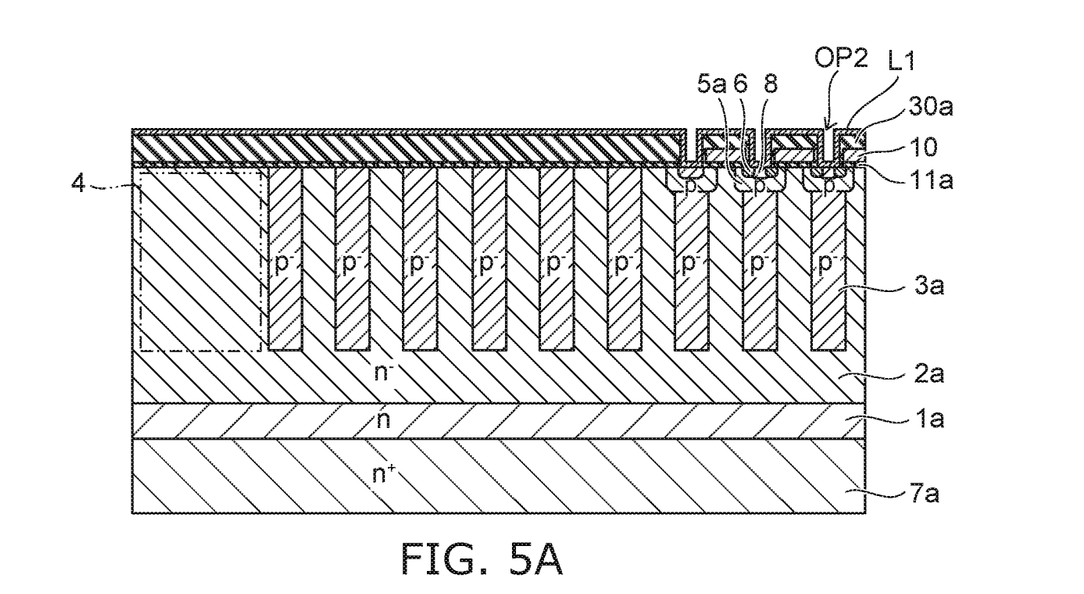
FIGS. 5A and 5B are cross-sectional views illustrating a method for manufacturing the semiconductor device according to the embodiment.

As illustrated in FIG. 5A, a first layer L1 that includes the first element is formed along the inner surfaces of the openings OP2. The first element is, for example, platinum. For example, the first layer L1 is formed by vapor deposition or sputtering of a target made of the first element. The first element that is included in the first layer L1 is diffused into the n⁻-type semiconductor layers 2a and 3a by heating. For example, the first element is diffused by heating at 840 degrees for 30 minutes. Thereby, the first element is diffused mainly into the p⁻-type semiconductor layers 3a and the n⁻-type semiconductor layer 2a positioned between the p⁻-type semiconductor layers 3a.

Or, the first element may be ion-implanted into the multiple p⁻-type semiconductor layers 3a via the openings OP2 by using the insulating layer 30a as a mask. The first element is diffused after the ion implantation by heating.

Figure 5B:
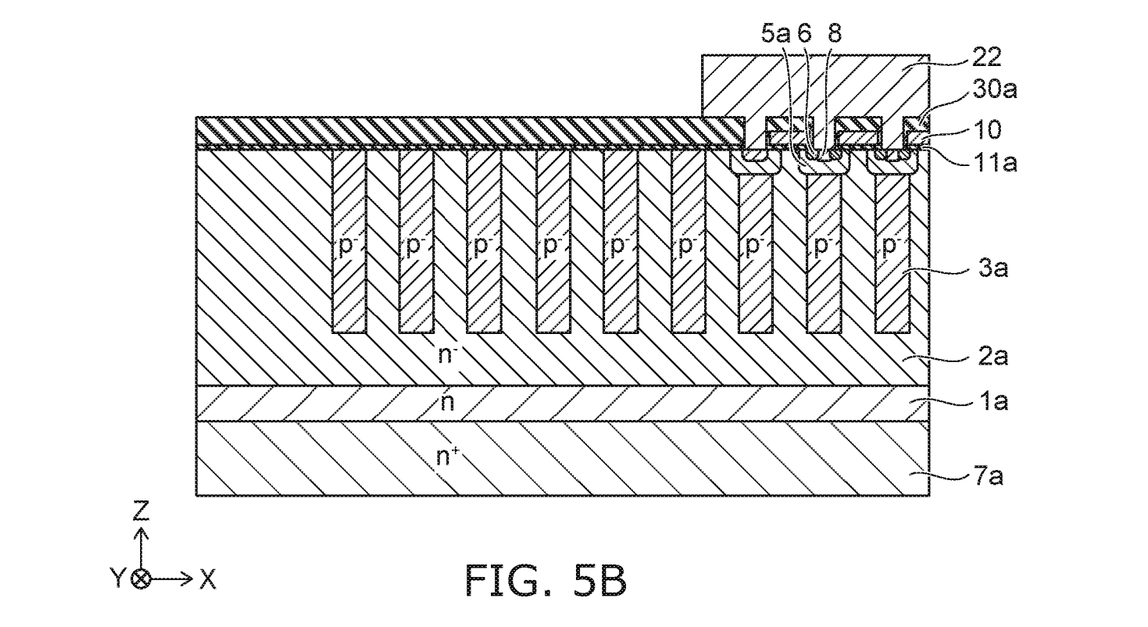

After diffusing the first element, the first layer L1 is removed. Or, a silicide layer of the first element may be formed by causing the first layer L1 and the semiconductor regions to react. A metal layer that covers the insulating layer 30a is formed by sputtering. As illustrated in FIG. 5B, the source electrode 22 is formed by patterning the metal layer.

Subsequently, the back surface of the n⁺-type semiconductor substrate 7a is polished until the n⁺-type semiconductor substrate 7a has a prescribed thickness. The drain electrode 21 is formed by sputtering on the polished back surface. The semiconductor device 100 according to the embodiment is manufactured by the processes described above.

Figure 6:
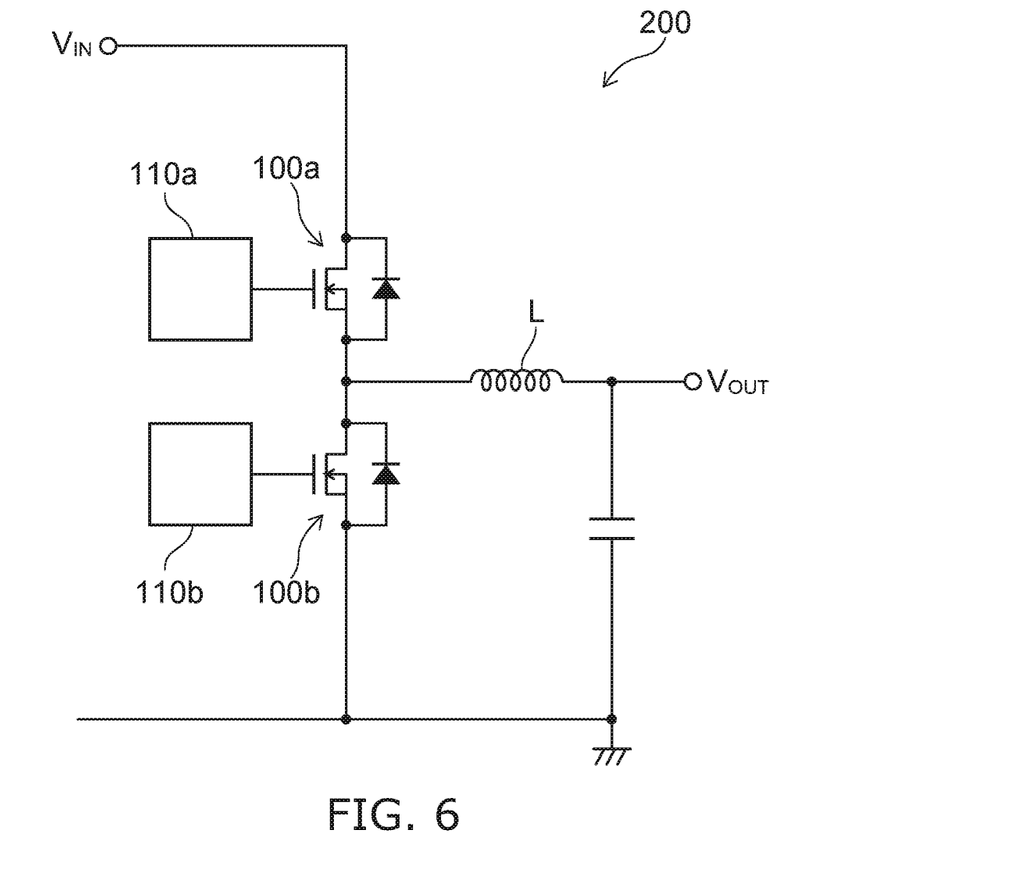
FIG. 6 is a circuit diagram illustrating an electrical device including the semiconductor device according to the embodiment.

FIG. 6 is a circuit diagram illustrating an electrical device including the semiconductor device according to the embodiment.

FIGS. 7A to 8C are schematic views illustrating operations of the electrical circuit illustrated in FIG. 6.

For example, the semiconductor device according to the embodiment is applicable to a converter. In the example illustrated in FIG. 6, the electrical device 200 is a buck converter. The electrical device 200 includes two semiconductor devices according to the embodiment, and two controllers respectively controlling the semiconductor devices.

In FIG. 6, the semiconductor device 100 of the high-voltage side is illustrated as a semiconductor device 100a. The semiconductor device 100 of the low-voltage side is illustrated as a semiconductor device 100b. Controllers 110a and 110b respectively control the semiconductor devices 100a and 100b.

In the buck converter, the semiconductor device 100a of the high-voltage side and the semiconductor device 100b of the low-voltage side are alternately set to the on-state by the operations of the controllers 110a and 110b. An output voltage $V_{OUT}$ that is less than an input voltage VIN is output thereby.

Figure 7A:
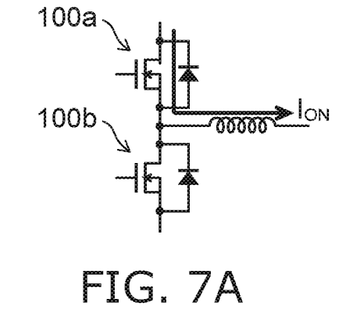
FIGS. 7A to 7D are schematic views illustrating operations of the electrical circuit illustrated in FIG. 6.
Figure 7B:
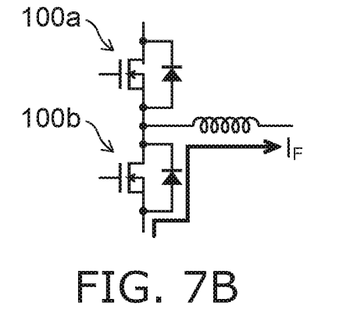

For example, as illustrated in FIG. 7A, an on-current $I_{ON}$ passes through the semiconductor device 100a and an inductor L and flows toward an output terminal when the semiconductor device 100a of the high-voltage side is in the on-state. When the semiconductor device 100a is turned off, an induced electromotive force is generated and causes the current to continue to flow in the inductor L. As illustrated in FIG. 7B, a freewheeling current IF is caused to flow in the diode of the semiconductor device 100b by the induced electromotive force.

Figure 7C:
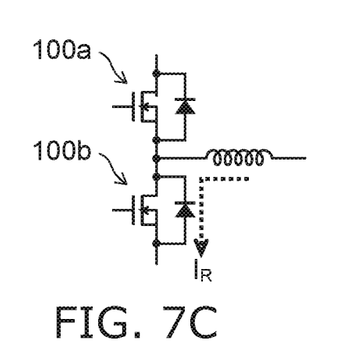

Then, the semiconductor device 100b is turned on. Directly after a voltage is applied to the gate electrode 10 of the semiconductor device 100b, the electrons and the holes that have accumulated in the semiconductor device 100b are ejected respectively from the drain electrode 21 and the source electrode 22. Thereby, as illustrated in FIG. 7C, a recovery current IR flows through the semiconductor device 100b. When the electrons and the holes that had accumulated in the semiconductor device 100b are ejected, the on-current $I_{ON}$ flows in the semiconductor device 100b as illustrated in FIG. 7D.

Figure 7D:
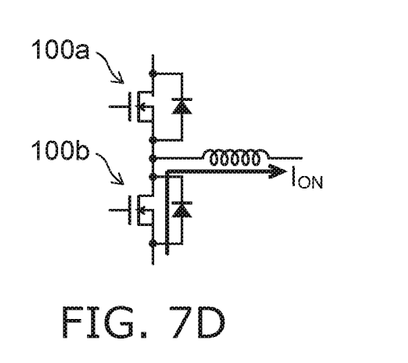
Figure 8A:
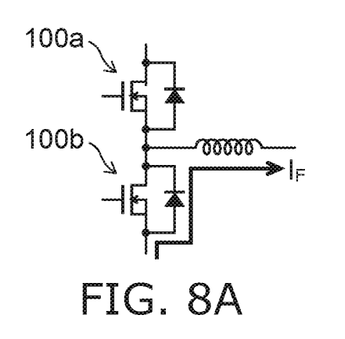
FIGS. 8A to 8C are schematic views illustrating operations of the electrical circuit illustrated in FIG. 6.
Figure 8B:
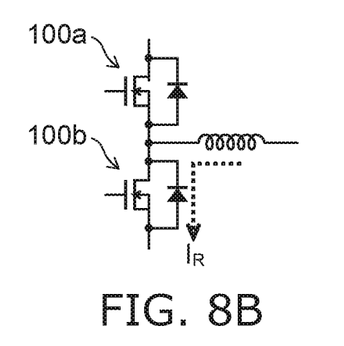

When the semiconductor device 100b is turned off after the state illustrated in FIG. 7D, the freewheeling current IF is caused to flow in the diode of the semiconductor device 100b by the induced electromotive force as illustrated in FIG. 8A. Then, when the semiconductor device 100a is turned on, the electrons and the holes that have accumulated in the semiconductor device 100b are ejected. Thereby, as illustrated in FIG. 8B, the recovery current IR flows through the semiconductor device 100b. When the electrons and the holes that had accumulated in the semiconductor device 100b are ejected, the on-current $I_{ON}$ flows in the semiconductor device 100a as illustrated in FIG. 8C.

Figure 9:
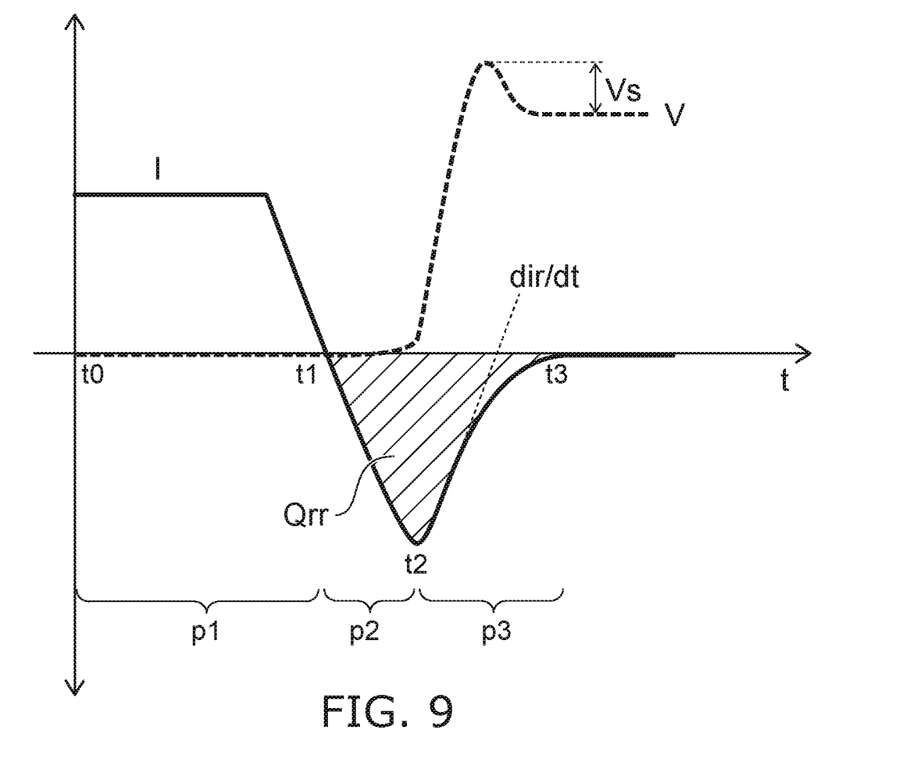
FIG. 9 is a graph illustrating the waveforms of the current and the voltage of the semiconductor device according to the embodiment.

FIG. 9 is a graph illustrating the waveforms of the current and the voltage of the semiconductor device according to the embodiment.

Figure 8C:
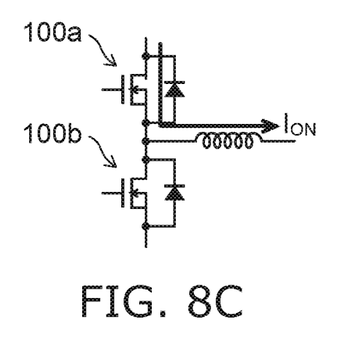

Specifically, FIG. 9 illustrates the characteristics of the semiconductor device 100b of the electrical device 200 illustrated in FIG. 6 when the recovery current IR flows as illustrated in FIGS. 8B and 8C. The solid line in FIG. 9 illustrates the current flowing through the diode. The current is illustrated as positive when flowing in the forward direction. The broken line illustrates the voltage of the drain electrode 21 with respect to the source electrode 22. The horizontal axis illustrates time.

In the example illustrated in FIG. 9, a period p1 from a timing t0 to a timing t1 corresponds to the state illustrated in FIG. 8A. The freewheeling current IF flows in the diode in the period p1. A period p2 from the timing t1 to a timing t2 and a period p3 from the timing t2 to a timing t3 correspond to the state illustrated in FIG. 8B. The recovery current IR flows in the diode in the periods p2 and p3.

After the peak of the recovery current IR at the timing t2, a voltage V of the drain electrode 21 with respect to the source electrode 22 rises. At this time, a surge voltage Vs occurs in the voltage V according to the slope dir/dt of the decrease of the recovery current IR. The voltage V reaches a steady state after the oscillation due to the surge voltage Vs.

Problems relating to the embodiment and effects of the embodiment will now be described.

To reduce the power consumption of the semiconductor device 100, it is desirable for an accumulated charge Qrr represented by the integral of the recovery current IR to be small. The accumulated charge Qrr is small when the recovery current IR is small (approaches zero). In the semiconductor device 100 according to the embodiment, the concentration of the first element in the junction region JR is greater than the concentration of the first element in the n-type buffer region 1 and greater than the concentration of the first element in the n⁻-type outer perimeter region 4. The carrier lifetime in each region decreases as the concentration of the first element increases. When the carrier lifetime in the junction region JR is short, the accumulated charge Qrr can be reduced more quickly, and the recovery current IR can be reduced.

However, there is a possibility that the decrease of the recovery current IR in the period p3 may cause an increase of dir/dt illustrated in FIG. 9. When dir/dt is large, the surge voltage Vs also is large. The noise that is generated in the electrical device 200 also increases as the surge voltage Vs increases. Therefore, it is desirable for dir/dt to be small.

In the semiconductor device 100 as illustrated in FIG. 1, a portion of the junction region JR is positioned in the element region where the source electrode 22 is provided. The charge that accumulates in the junction region JR is ejected mainly in the period p2 in which the recovery current IR starts to flow. By reducing the carrier lifetime in the junction region JR, the recovery current IR in the period p2 can be reduced.

The n-type outer perimeter region 4 is positioned around the junction region JR. The charge that accumulates in the n⁻-type outer perimeter region 4 is ejected mainly in the period p3 after the charge accumulated in the junction region JR is ejected. Also, the concentration of the first element in the n⁻-type outer perimeter region 4 is greater than the concentration of the first element in the junction region JR. Therefore, the charge that is accumulated in the n⁻-type outer perimeter region 4 does not disappear easily compared to the charge accumulated in the junction region JR. The decrease of the recovery current IR in the period p3 is suppressed by ejecting the charge accumulated in the n⁻-type outer perimeter region 4 after the carriers accumulated in the junction region JR are ejected and have disappeared. Thereby, dir/dt can be reduced, and the surge voltage Vs can be reduced.

In the semiconductor device 100, the carrier lifetime in the n-type buffer region 1 is longer than the carrier lifetime in the junction region JR. The disappearance of the charge in the n-type buffer region 1 can be suppressed thereby, and the charge is easily ejected from the drain electrode 21. By suppressing the disappearance of the charge flowing from the n⁻-type outer perimeter region 4 toward the n-type buffer region 1, the decrease of the recovery current IR in the period p3 can be suppressed further. dir/dt can be further reduced thereby.

As described above, according to the embodiment, the recovery current IR in the period p2 can be reduced, and the power consumption of the semiconductor device 100 can be reduced. Also, according to the embodiment, even when the recovery current IR in the period p2 is reduced, the decrease of the recovery current IR in the period p3 can be suppressed, and the surge voltage can be reduced.

Figure 10A:
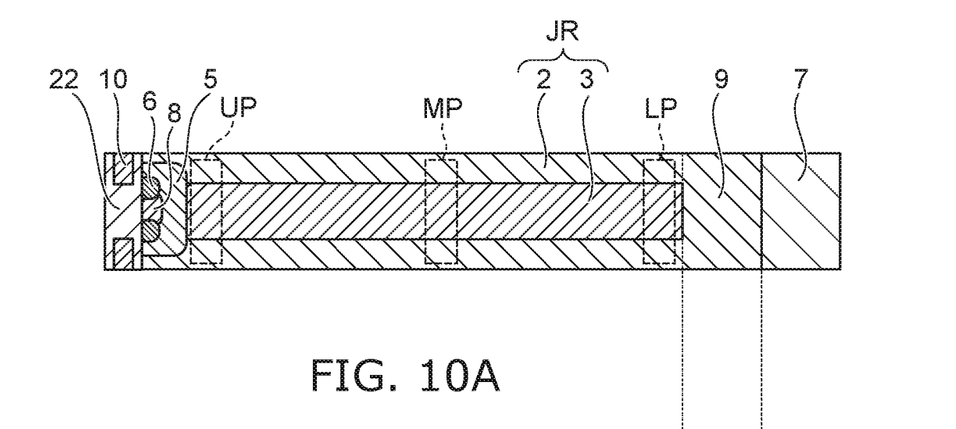
FIGS. 10A and 10B are schematic views illustrating analysis results of the semiconductor device according to the embodiment.
Figure 10B:
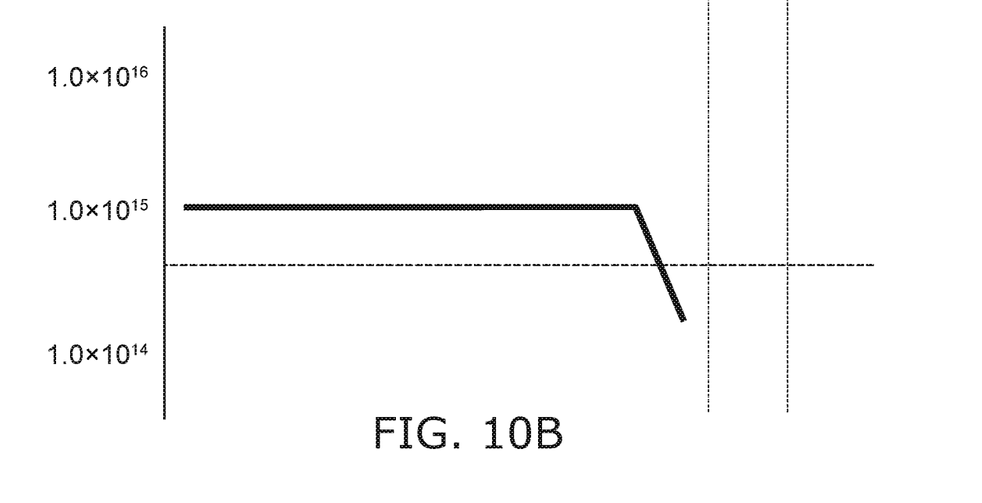

FIGS. 10A and 10B are schematic views illustrating analysis results of the semiconductor device according to the embodiment.

FIGS. 10A and 10B illustrate the results of an analysis of a portion of the semiconductor device 100 by secondary ion mass spectrometry (SIMS). FIG. 10A illustrates the portion of the semiconductor device 100. FIG. 10B illustrates the number of atoms of platinum at multiple points in the Z-direction in the region illustrated in FIG. 10A. The sum of the number of atoms for the n$^-$-type pillar region 2 and the p$^-$-type pillar region 3 is illustrated in the junction region JR. In FIG. 10B, the broken line illustrates the detection limit.

As illustrated in FIGS. 10A and 10B, the number of atoms of platinum in an upper portion UP of the junction region JR was substantially equal to the number of atoms of platinum in a middle portion MP of the junction region JR. It was confirmed from multiple analysis results of the semiconductor device 100 that the ratio of the concentration of platinum in the middle portion MP to the concentration of platinum in the upper portion UP was not less than 0.6 and not more than 1.4. On the other hand, the number of atoms of platinum in a lower portion LP of the junction region JR was less than the number of atoms of platinum in the upper portion UP and the number of atoms of platinum in the middle portion MP. The ratio of the concentration of platinum in the lower portion LP to the concentration of platinum in each of the upper and middle portions UP and MP was 0.1 or less. Also, the ratio of the concentration of platinum in each of the n-type buffer region 1, the n$^-$-type outer perimeter region 4, and the n$^-$-type semiconductor region 9 to the concentration of platinum in each of the upper and middle portions UP and MP was 0.1 or less.

For example, the positions of the upper portion UP, the middle portion MP, and the lower portion LP can be determined as follows. The position in the Z-direction of the upper portion UP corresponds to the position in the Z-direction of the p$^-$-type pillar region 3 upper portion adjacent to the p-type base region 5. The boundary between the p$^-$-type pillar region 3 and the p-type base region 5 is determined based on the analysis results of the p-type impurity concentration along a line passing through the p$^-$-type pillar region 3 and the p-type base region 5. The regions in which the p-type impurity concentrations are substantially constant are determined respectively to be the p$^-$-type pillar region 3 and the p-type base region 5, and the middle between the p$^-$-type pillar region 3 and the p-type base region 5 is determined to be the boundary between the p$^-$-type pillar region 3 and the p-type base region 5. The lower portion LP is positioned at the vicinity of the p-n junction surface between the p$^-$-type pillar region 3 and the n-type buffer region 1 (or the n$^-$-type semiconductor region 9). The middle portion MP is positioned at the middle in the Z-direction between the lower portion LP and the upper portion UP.

In the embodiment, it is sufficient for at least the concentration of platinum in each of the upper and middle portions UP and MP to be greater than the concentration of platinum in each of the n-type buffer region 1 and the n$^-$-type outer perimeter region 4. If the concentration of platinum in at least each of the upper and middle portions UP and MP is greater than the concentration of platinum in each of the n-type buffer region 1 and the n$^-$-type outer perimeter region 4, the concentration of platinum in the junction region JR can be considered to be greater than the concentration of platinum in each of the n-type buffer region 1 and the n$^-$-type outer perimeter region 4.

From the perspective of reducing the power consumption and dir/dt, it is favorable for the concentration of the first element in the junction region JR to be not less than 4 times the concentrations of the first element in the n-type buffer region 1 and the n$^-$-type outer perimeter region 4. On the other hand, if the concentration of the first element is too high, the leakage current increases when the semiconductor device 100 is in the off-state. Therefore, it is favorable for the concentration of the first element in the junction region JR to be not more than 50 times the concentrations of the first element in the n-type buffer region 1 and the n$^-$-type outer perimeter region 4.

According to the manufacturing method described in reference to FIGS. 3A to 5B, it was found that the first element can be diffused mainly in the junction region JR while suppressing the diffusion of the first element into the n-type buffer region 1 and the n$^-$-type outer perimeter region 4 as illustrated in FIGS. 10A and 10B.

In other words, in the manufacturing method according to the embodiment, the first element is diffused into the junction region JR of the structure body in which the semiconductor regions are formed via the gaps between the gate electrodes 10. As illustrated in FIG. 5A, the structure body includes the n-type semiconductor layer 1a, the multiple n$^-$-type semiconductor layers 2a, the multiple p$^-$-type semiconductor layers 3a, the n$^-$-type outer perimeter region 4, the multiple p-type base regions 5, the multiple n$^+$-type source regions 6, the multiple p$^+$-type contact regions 8, the multiple gate electrodes 10, and the insulating layer 30a. According to the manufacturing method according to the embodiment, the concentration of the first element in the junction region JR can be greater than the concentrations of the first element in the n-type buffer region 1 and the n$^-$-type outer perimeter region 4.

It is considered that the concentration relationship described above occurs due to the following reasons. As illustrated in FIGS. 3A and 3B, interfaces are formed between the n$^-$-type semiconductor layer 2a and the p$^-$-type semiconductor layers 3a when the openings OP1 are formed and the junction region JR is formed by epitaxially growing the p-type semiconductor layers. The first element easily diffuses along the interfaces. Also, the first element diffuses in the n$^-$-type semiconductor layer 2a between the interfaces. It is considered that as a result, by diffusing the first element into a portion of the junction region JR via the openings OP2, the first element is diffused substantially uniformly in the junction region JR in the X-direction and the Y-direction.

An example is described above in which the carrier lifetime is controlled using the first element. Instead of the concentration of the first element, the carrier lifetime may be controlled by adjusting the density of crystal defects. In such a case, the density of crystal defects in the junction region JR is greater than the density of crystal defects in the n-type buffer region 1 and greater than the density of crystal defects in the n$^-$-type outer perimeter region 4. For example, crystal defects can be generated by irradiating an electron beam. The density of crystal defects can be regarded as a density of traps. That is, the density of traps in the junction region JR may be greater than the density of traps in the n-type buffer region 1 and greater than the density of traps in the n$^-$-type outer perimeter region 4. The carrier lifetime may be controlled by adjusting both the concentration of the first element and the density of crystal defects.

In each of the embodiments described above, it is possible to confirm the relative levels of the impurity concentrations between the semiconductor regions by using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. It is also possible to measure the impurity concentration in each semiconductor region by, for example, SIMS.

In each embodiment described above, for example, the concentration or the density of lifetime killers in each semiconductor region can be compared using deep level transient spectroscopy (DLTS) or isothermal capacitance transient spectroscopy (ICTS). For example, the density of traps can be measured by DLTS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
   a first electrode;
   a first semiconductor region provided on the first electrode and electrically connected to the first electrode, the first semiconductor region being of a first conductivity type;
   a junction region provided on the first semiconductor region, the junction region including
      a second semiconductor region of the first conductivity type, an impurity concentration of the first conductivity type in the second semiconductor region being less than an impurity concentration of the first conductivity type in the first semiconductor region, and
      a third semiconductor region of a second conductivity type,
      a plurality of the second semiconductor regions and a plurality of the third semiconductor regions being alternately provided in a second direction perpendicular to a first direction, the first direction being from the first electrode toward the first semiconductor region;
   a fourth semiconductor region provided around the junction region along a first plane perpendicular to the first direction, the fourth semiconductor region being of the first conductivity type, an impurity concentration of the first conductivity type in the fourth semiconductor region being less than the impurity concentration of the first conductivity type in the first semiconductor region;
   a fifth semiconductor region provided on one of the plurality of third semiconductor regions, the fifth semiconductor region being of the second conductivity type;
   a sixth semiconductor region provided on the fifth semiconductor region, the sixth semiconductor region being of the first conductivity type;
   a gate electrode facing the fifth semiconductor region via a gate insulating layer; and
   a second electrode provided on the fifth and sixth semiconductor regions, the second electrode being electrically connected to the fifth and sixth semiconductor regions,
   wherein a concentration of a first element in the junction region is greater than a concentration of the first element in the first semiconductor region and greater than a concentration of the first element in the fourth semiconductor region, the first element is at least one selected from the group consisting of a heavy metal element and a proton, a ratio of a concentration of the first element in a middle portion of the junction region to a concentration of the first element in an upper portion of the junction region is not less than 0.6 and not more than 1.4, a ratio of a concentration of the first element in a lower portion of the junction region to the concentration of the first element in each of the upper portion and the middle portion is 0.1 or less, or
   wherein a density of traps in the junction region is greater than a density of traps in the first semiconductor region and greater than a density of traps in the fourth semiconductor region, a ratio of a density of traps in a middle portion of the junction region to a density of traps in an upper portion of the junction region is not less than 0.6 and not more than 1.4, a ratio of a density of traps in a lower portion of the junction region to the density of traps in each of the upper portion and the middle portion is 0.1 or less.

2. The device according to claim 1, wherein
   concentrations of the first element in the second and third semiconductor regions each are greater than the concentration of the first element in the first semiconductor region and greater than the concentration of the first element in the fourth semiconductor region, or
   densities of traps in the second and third semiconductor regions each are greater than the density of traps in the first semiconductor region and greater than the density of traps in the fourth semiconductor region.

3. The device according to claim 1, wherein
   the concentration of the first element in the junction region is greater than the concentration of the first element in the first semiconductor region and greater than the concentration of the first element in the fourth semiconductor region, and
   the first element is at least one selected from the group consisting of gold, ruthenium, rhodium, palladium, osmium, iridium, and platinum.

4. The device according to claim 3, wherein
   a ratio of a concentration of the first element in an upper portion of the junction region to a concentration of the first element in a middle portion of the junction region in the first direction is not less than 0.6 and not more than 1.4.

5. The device according to claim 3, wherein
   the concentration of the first element in the junction region is not less than 4 times and not more than 50 times each of the concentration of the first element in the first semiconductor region and the concentration of the first element in the fourth semiconductor region.

6. The device according to claim 1, further comprising:
   a seventh semiconductor region provided between the first electrode and the first semiconductor region, the seventh semiconductor region being of the first conductivity type and including a higher first-conductivity-type impurity concentration than the first semiconductor region.

7. The device according to claim 1, wherein
the concentration of the first element in the junction region is not less than 4 times the concentrations of the first element in the first semiconductor region and the fourth semiconductor region and not more than 50 times the concentrations of the first element in the first semiconductor region and the fourth semiconductor region, or
the density of traps in the junction region is not less than 4 times the densities of traps in the first semiconductor region and the fourth semiconductor region and not more than 50 times the densities of traps in the first semiconductor region and the fourth semiconductor region.

8. The device according to claim 1, wherein
the upper portion contacts with the fifth semiconductor region,
the lower portion contacts with the first semiconductor region, and
the middle portion is positioned between the lower portion and the upper portion in the first direction.

9. A semiconductor device, comprising:
a first electrode;
a first semiconductor region provided on the first electrode and electrically connected to the first electrode, the first semiconductor region being of a first conductivity type;
a junction region provided on the first semiconductor region, the junction region including
 a second semiconductor region of the first conductivity type, an impurity concentration of the first conductivity type in the second semiconductor region being less than an impurity concentration of the first conductivity type in the first semiconductor region, and
 a third semiconductor region of a second conductivity type,
 a plurality of the second semiconductor regions and a plurality of the third semiconductor regions being alternately provided in a second direction perpendicular to a first direction, the first direction being from the first electrode toward the first semiconductor region;
a fourth semiconductor region provided around the junction region along a first plane perpendicular to the first direction, the fourth semiconductor region being of the first conductivity type, an impurity concentration of the first conductivity type in the fourth semiconductor region being less than the impurity concentration of the first conductivity type in the first semiconductor region;
a fifth semiconductor region provided on one of the plurality of third semiconductor regions, the fifth semiconductor region being of the second conductivity type;
a sixth semiconductor region provided on the fifth semiconductor region, the sixth semiconductor region being of the first conductivity type;
a gate electrode facing the fifth semiconductor region via a gate insulating layer; and
a second electrode provided on the fifth and sixth semiconductor regions, the second electrode being electrically connected to the fifth and sixth semiconductor regions,
wherein a concentration of a first element in the junction region is greater than a concentration of the first element in the first semiconductor region and greater than a concentration of the first element in the fourth semiconductor region, the first element is at least one selected from the group consisting of a heavy metal element and a proton, a ratio of a concentration of the first element in a middle portion of the junction region to a concentration of the first element in an upper portion of the junction region is not less than 0.6 and not more than 1.4, a ratio of a concentration of the first element in a lower portion of the junction region to the concentration of the first element in each of the upper portion and the middle portion is 0.1 or less.

10. The device according to claim 9, wherein
the concentration of the first element in the junction region is not less than 4 times the concentrations of the first element in the first semiconductor region and the fourth semiconductor region and not more than 50 times the concentrations of the first element in the first semiconductor region and the fourth semiconductor region.

11. The device according to claim 9, wherein
the upper portion contacts with the fifth semiconductor region,
the lower portion contacts with the first semiconductor region, and
the middle portion is positioned between the lower portion and the upper portion in the first direction.

12. The device according to claim 9, wherein
the first element is at least one selected from the group consisting of gold, ruthenium, rhodium, palladium, osmium, iridium, and platinum.

13. A method for manufacturing a semiconductor device, the method comprising:
diffusing a first element into a junction region of a structure body, the first element being at least one selected from the group consisting of a heavy metal element and a proton,
the structure body including
 a first semiconductor region of a first conductivity type,
 the junction region provided on the first semiconductor region, the junction region including
  a second semiconductor region of the first conductivity type, an impurity concentration of the first conductivity type in the second semiconductor region being less than an impurity concentration of the first conductivity type in the first semiconductor region, and
  a third semiconductor region of a second conductivity type,
  a plurality of the second semiconductor regions and a plurality of the third semiconductor regions being alternately provided in a second direction perpendicular to a first direction, the first direction being from the first electrode toward the first semiconductor region,
 a fourth semiconductor region provided around the junction region along a first plane perpendicular to the first direction, the fourth semiconductor region being of the first conductivity type and including a lower first-conductivity-type impurity concentration than the first semiconductor region,
 a plurality of fifth semiconductor regions provided respectively on the plurality of third semiconductor regions, the plurality of fifth semiconductor regions being of the second conductivity type,
 a plurality of sixth semiconductor regions provided respectively on the plurality of fifth semiconductor regions, the plurality of sixth semiconductor regions being of the first conductivity type,
 a plurality of gate electrodes provided on the plurality of fifth semiconductor regions and the plurality of sixth semiconductor regions, the plurality of gate electrodes respectively facing the plurality of fifth semiconductor regions via a plurality of gate insulating layers, and an insulating layer provided on the junction region and the fourth semiconductor region around the plurality of gate electrodes, the diffusion causing a concentration of the first element in the junction region to be greater than a concentration of the first element in the first semiconductor region and greater than a concentration of the first element in the fourth semiconductor region by diffusing the first element via a gap between mutually-adjacent gate electrodes of the plurality of gate electrodes, wherein, after the diffusion, a ratio of a concentration of the first element in a middle portion of the junction region to a concentration of the first element in an upper portion of the junction region is not less than 0.6 and not more than 1.4, a ratio of a concentration of the first element in a lower portion of the junction region to the concentration of the first element in each of the upper portion and the middle portion is 0.1 or less.

14. The method according to claim 13, wherein after the diffusion, the concentration of the first element in the junction region is not less than 4 times the concentrations of the first element in the first semiconductor region and the fourth semiconductor region and not more than 50 times the concentrations of the first element in the first semiconductor region and the fourth semiconductor region.

15. The method according to claim 13, wherein the upper portion contacts with the fifth semiconductor region, the lower portion contacts with the first semiconductor region, and the middle portion is positioned between the lower portion and the upper portion in the first direction.

16. The method according to claim 13, wherein the first element is at least one selected from the group consisting of gold, ruthenium, rhodium, palladium, osmium, iridium, and platinum.

* * * * *